(12) United States Patent
Abughazaleh et al.

(10) Patent No.: US 6,184,813 B1
(45) Date of Patent: Feb. 6, 2001

(54) METHOD AND APPARATUS FOR SYNCHRONIZING SIGNALS

(75) Inventors: Firas N. Abughazaleh; Vijayakumaran V. Nair, both of Austin, TX (US)

(73) Assignee: Legerity, Inc., Austin, TX (US)

(*) Notice: Under 35 U.S.C. 154(b), the term of this patent shall be extended for 0 days.

(21) Appl. No.: 09/197,197

(22) Filed: Nov. 20, 1998

(51) Int. Cl.[7] .................................................. H03M 1/66
(52) U.S. Cl. .............................................................. 341/144
(58) Field of Search ........................................ 341/144, 147

(56) References Cited

U.S. PATENT DOCUMENTS

| | | | |
|---|---|---|---|
| 4,335,445 | * 6/1982 | Nercessian | 341/144 |
| 4,801,923 | * 1/1989 | Schwartz et al. | 341/144 |
| 5,274,376 | * 12/1993 | Phillips et al. | 341/144 |
| 5,585,802 | * 12/1996 | Cabler et al. | 341/144 |
| 5,900,830 | * 5/1999 | Scheffler | 341/144 |

* cited by examiner

*Primary Examiner*—Trong Phan
(74) *Attorney, Agent, or Firm*—Williams, Morgan & Amerson, P.C.

(57) ABSTRACT

A method and apparatus is provided for synchronizing the arrival of data delivered over a first and second path. The method includes generating a first clock signal; delivering the data to the first path in response to receiving the first clock signal; delaying the first clock signal by a preselected time, wherein the first preselected time substantially corresponds to a difference in the time required for the data to propagate the first and second paths; and delivering the data to the second path in response to receiving the delayed clock signal.

34 Claims, 7 Drawing Sheets

METHOD AND APPARATUS FOR SYNCHRONIZING SIGNALS

BACKGROUND OF THE INVENTION

1. Field of the Invention

This invention relates generally to electrical circuits, and, more particularly, to synchronizing the arrival times of signals at an output terminal in electrical circuits. Still more particularly, the present invention relates to synchronizing the arrival times of signals at an output terminal in a digital to analog converter.

2. Description of the Related Art

Electrical components such as resistors, capacitors, inductors, and transistors are routinely implemented in electrical circuits. The type of electrical component utilized in an electrical circuit will depend on the particular implementation. Designers typically weigh the advantages and disadvantages of each type of electrical component before selecting the desired component. For example, an electrical circuit implemented in silicon can employ a variety of resistors, such as poly-crystalline silicon or diffusion-type resistors (hereinafter referred to as "diffusion" resistors). While poly-crystalline silicon and/or diffusion resistors serve their intended purpose of providing adequate resistance in an electrical circuit, such resistors have a tendency to sometimes introduce undesirable electrical characteristics such as parasitic capacitance.

The parasitic capacitance of the poly-crystalline silicon, diffusion, or other resistors tends to introduce undesirable signal-propagation delays in electrical circuits, thereby preventing the signals from arriving at their intended destination in proper synchronism. Because of propagation delays, signals arriving late at their intended destination, such as an output terminal, for instance, may contribute to higher levels of noise at the output terminal. The undesirable effects caused by the parasitic capacitance of resistors can be illustrated with reference to a digital-to-analog (D/A) converter 100 shown in FIG. 1.

For clarity, only a portion of the D/A converter 100 that is necessary to illustrate the undesirable effects caused by the parasitic capacitance is shown in FIG. 1. Specifically, FIG. 1 illustrates a simplified block diagram of an n-bit R2R D/A converter 100, which is constructed using diffusion resistors 110. Although the R2R D/A converter 100 is illustrated having diffusion resistors 110, it is should be apparent to those skilled in the art that other types of resistors may also be employed in the R2R D/A converter 100.

The D/A converter 100 includes a plurality of latches 120($a$–$n$) that activate a corresponding plurality of switches 130($a$–$n$) in response to receiving a synchronization signal on a line 140. The number of latches 120($a$–$n$) and switches 130($a$–$n$) required in a particular implementation may vary, depending on the number of bits that are converted by the D/A converter 100 in response to each synchronization signal on the line 140. For example, in one embodiment, converting 16 bits may require sixteen latches 120($a$–$n$) and switches 130($a$–$n$) (where "a" equals 1 and "n" equals 16). The synchronization signal on the line 140 in the illustrated embodiment is a strobe signal that is substantially simultaneously provided to the latches 120($a$–$n$). The latches 120($a$–$n$) store respective bit signals on lines 150($a$–$n$) that are provided by an interpolator (not shown). The latches 120($a$–$n$) provide the bit signals to the respective plurality of switches 130($a$–$n$) in response to the strobe signal on the line 140. The switches 130($a$–$n$) connect either to a ground or non-ground node 155, 160 when the latches 120($a$–$n$) are strobed by the strobe signal on the line 140, depending on the value of the bit signal stored in the latches 120($a$–$n$).

In the illustrated embodiment, a first latch 120$a$ and a last latch 120$n$ of the plurality of latches 120($a$–$n$) are adapted to receive the least significant bit (LSB) and most significant bit (MSB), respectively. Accordingly, although not shown, the intermediate latches 120($c$ to $n$–1) between the first and last latches 120$a$, 120$n$ are adapted to receive the respective intermediate bit signals.

Because of the parasitic capacitance associated with the diffusion resistors 110, the least significant bit applied to the first latch 120$a$ suffers the longest delay from the moment it is strobed-in until it reaches an output node 192 of the D/A converter 100. On the other hand, the most significant bit, when applied to the last latch 120$n$, which is closest to the output node 192, reaches the output node 192 with minimum delay. The mismatch in the arrival times due to the parasitic capacitance of the diffusion resistors 110 results in an undesirable spike (not shown) at the output node 192.

The size of the spike is a function of the unit parasitic capacitance, as well as the digital code applied. That is, a larger unit of capacitance means a longer delay, and, hence, a wider spike for a given digital code. Moreover, a more significant code transition (i.e., where n switches from 31 to 32 binary digits, as opposed to switching from 15 to 16 bits) may also result in a wider and higher spike. Such spikes generally tend to adversely affect the signal-to-distortion (STD) ratio of a signal at the output node 192.

The present invention is directed to overcoming, or at least reducing the effects of, one or more of the problems set forth above.

SUMMARY OF THE INVENTION

In one aspect of the present invention, a method is provided for synchronizing the arrival of data delivered over a first and second path. The method includes generating a first clock signal; delivering the data to the first path in response to receiving the first clock signal; delaying the first clock signal by a preselected time, wherein the first preselected time substantially corresponds to a difference in the time required for the data to propagate the first and second paths; and delivering the data to the second path in response to receiving the delayed clock signal.

In another aspect of the instant invention, an apparatus is provided that includes a first and second storing device, and a clock generator. The first storing device includes an input terminal and a strobe input terminal, the first storing device capable of providing data from the input terminal and delivering the data to a first path in response to a first strobe signal. The second storing device includes an input terminal and a strobe input terminal, the second storing device capable of providing data from the input terminal and delivering the data to a second path in response to a second strobe signal. The clock generator is capable of providing a first clock signal to the strobe input terminal of the first storing device and capable of providing a second strobe signal to the strobe input terminal of the second storing device, wherein the second strobe signal is provided a preselected time after the first strobe signal and wherein the first preselected time substantially corresponds to a difference in the time required for the data to propagate the first and second paths.

BRIEF DESCRIPTION OF THE DRAWINGS

The invention may be understood by reference to the following description taken in conjunction with the accompanying drawings, in which like reference numerals identify like elements, and in which.

Figure 1:
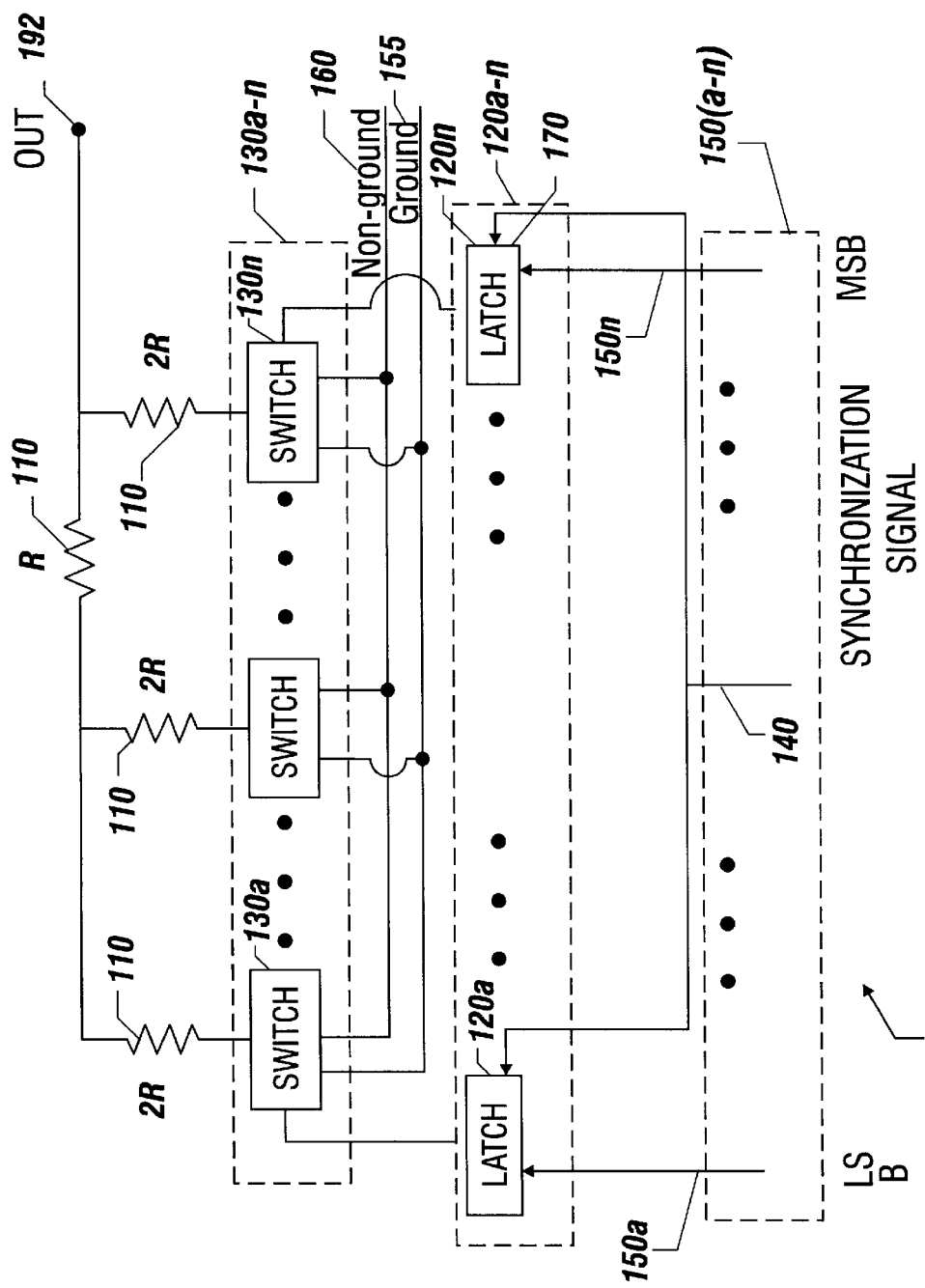
FIG. 1 is a stylized block diagram of a prior art R2R digital-to-analog converter.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
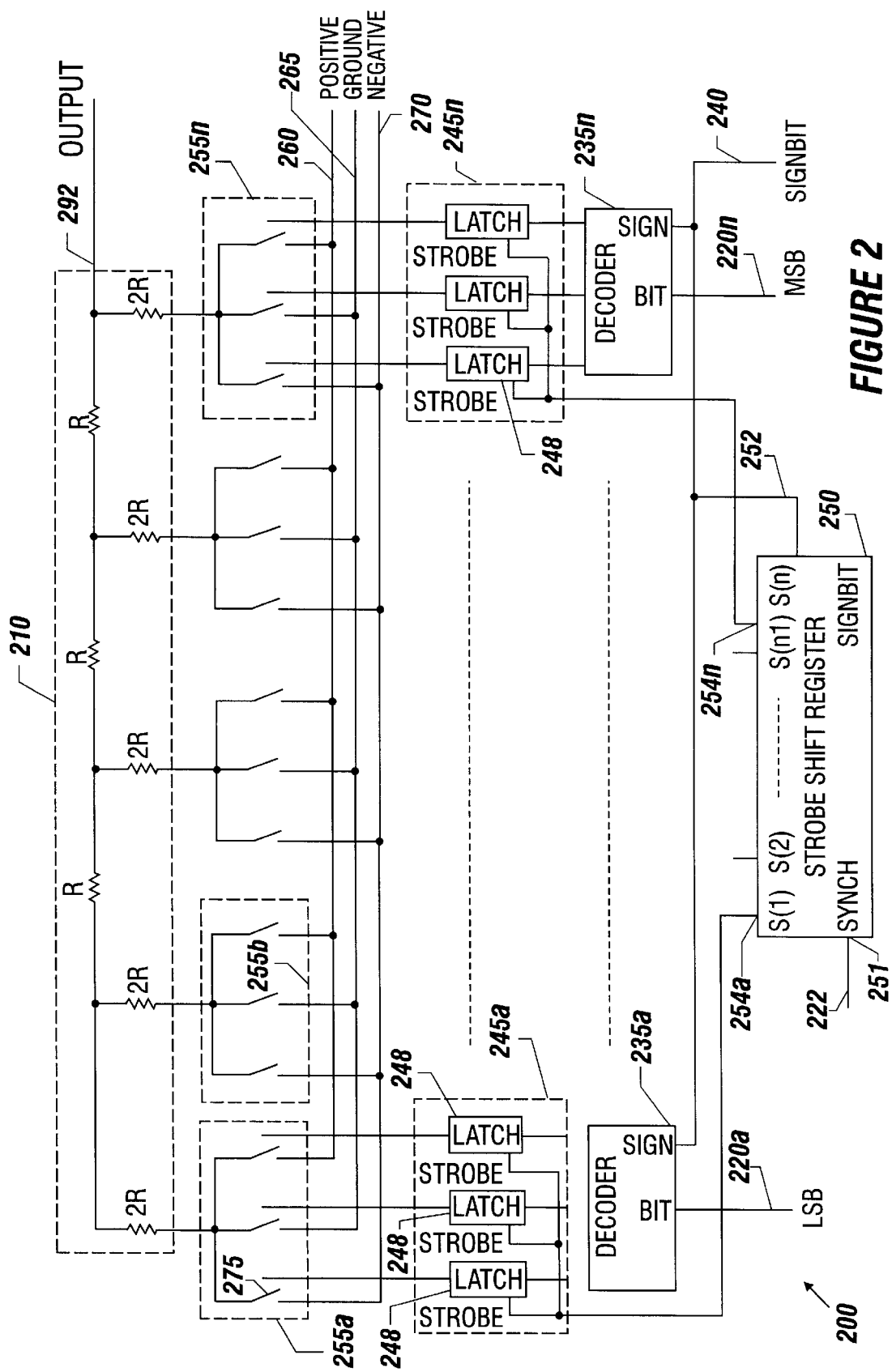
FIG. 2 illustrates a digital-to-analog converter in accordance with the present invention.

Referring now to FIG. 2, an n-bit D/A converter 200 in accordance with the present invention is illustrated, where n is equal to, or greater than, one. Although not so limited, FIG. 1 illustrates an R2R D/A converter 200, which is constructed using diffusion resistors 210. In one embodiment, the converter 200 may be a 12-bit D/A converter 200.

The n-bit D/A converter 200 is capable of converting a plurality of bit signals on lines 220($a$–$n$) to a single analog value in response to a control signal (herein after referred to as a "synchronization" signal) from an interpolator (not shown) on a line 222. The bit signals on the lines 220($a$–$n$) represent a sample of a digital code that is converted to a single analog value when the synchronization signal is asserted on the line 222 by the interpolator each sample period. The combination of a plurality of single analog values produces a continuous analog waveform.

The D/A converter 200 comprises a plurality of decoders 235($a$–$n$) that receive and decode the respective bit signals on the lines 220($a$–$n$). The D/A converter 200 also includes a set of memory devices 245($a$–$n$). In the illustrated embodiment the memory devices 245($a$–$n$) are latches 245($a$–$n$), although in other embodiments, the memory devices 245 ($a$–$n$) may be registers, capacitors, or any other conventional electrical components capable of retaining a charge. Each decoder 235($a$–$n$) has a corresponding set of latches 245 ($a$–$n$) that are capable of latching the output signals of the decoders 235($a$–$n$). In the illustrated embodiment, the decoders 235($a$–$n$) are 1-to-3 decoders. The decoders 235 ($a$–$n$) decode the respective bit signals on the lines 220($a$–$n$) in response to a sign bit signal received on a line 240. The interpolator (not shown) provides the bit signals on the lines 220($a$–$n$), as well as the sign bit signal on the line 240.

FIG. 2 illustrates the first and last decoders 235$a$, 235$n$ having corresponding first and last set of latches 245$a$, 245$n$. Generally one latch 248 is required for latching the data from each output terminal of the decoders 235($a$–$n$). Accordingly, in the illustrated embodiment, each set of latches 245($a$–$n$) has three latches 248, one for each output terminal of the decoders 235($a$–$n$). The intermediate decoders 235($b$ to $n$-1) and their respective set of latches 245($b$ to $n$ –1) have been omitted to avoid obscuring the invention.

The D/A converter 200 includes a strobe generator 250, which in the illustrated embodiment is a strobe shift register 250. The strobe generator 250 in other embodiments can be any clock source capable of providing a plurality of staggered clock signals, as will be described in more detail below. The strobe shift register 250 includes a synchronization-input terminal 251, signbit-input terminal 252, and a plurality of output terminals 254($a$–$n$). The synchronization-input terminal 251 is adapted to receive a synchronization signal from an interpolator (not shown) on a line 222. The synchronization signal on the line 222 may be any of a variety of clock signals, although in the illustrated embodiment it is a strobe signal.

To prevent the D/A converter 200 from constantly polling the interpolator (not shown) for data (i.e., a sample of digital code), the interpolator provides the bit signals on the lines 220($a$–$n$) to the decoders 235($a$–$n$) and then provides the synchronization signal on the line 222 to allow the D/A converter 200 to accept the data. The strobe shift register 250 provides n strobe signals from the output terminals 254($a$–$n$) in response to one synchronization signal on the line 222. The n strobe signals from the output terminals 254($a$–$n$) are capable of strobing the respective set of latches 245($a$–$n$).

The D/A converter 200 includes a set of switches 255 ($a$–$n$) that connect to either a positive, ground, or negative node 260, 265, 270 in response to the output signal of the respective set of latches 245($a$–$n$). In one embodiment, the switches 255($a$–$n$) can be p-n pass gate switches. In other embodiments, the switches 255($a$–$n$) may include any electrical component capable of a completing an electrical connection in response to a control input. Generally, only one switch 275 from each set of switches 255($a$–$n$) closes in response to the output signal from the respective set of latches 245($a$–$n$).

In the illustrated embodiment, the first and last latches 245$a$, 245$n$ are adapted to receive the least and most significant bit signal 220$a$, 220$n$, respectively. Accordingly, although not shown, the intermediate set of latches 245($b$ to $n$ –1) are adapted to receive the intermediate bit signals 220($b$ to $n$ –1).

To ensure that all signals arrive substantially at the same time at the output terminal 292 of the D/A converter 200 when the synchronization signal is asserted on the line 222, the strobe shift register 250 staggers the strobing of the sets of latches 245($a$–$n$) of the bit signals on the lines 220($a$–$n$).

That is, to ensure that the data for the LSB signal on the line 220a reaches the output terminal 292 at substantially the same time as the data for the MSB signal on the line 220n, the strobe shift register 250 delays the last strobe signal to the last set of latches 245n by a selected interval. The selected interval is equal to the difference between the time it takes the data for the LSB signal on the line 220a and the MSB signal on the line 220n to propagate to the output terminal 292 of the D/A converter 200. A progressively shorter strobe delay is applied to a next lower bit signal from the MSB signal down to the LSB signal, which has substantially zero delay. Because of the symmetrical structure of the resistors 210 of the R2R D/A converter 200, the propagation delay from an output terminal of one set of switches 255(a–n) to the next set of switches 255(a–n) is generally constant. Thus, the strobe signals that are provided by the strobe shift register 250 to strobe the corresponding set of latches 245(a–n) are asserted a constant interval apart. However, it is envisioned that the staggering of the strobe signals may be at varied intervals, as needed by the specific embodiment.

Figure 3:
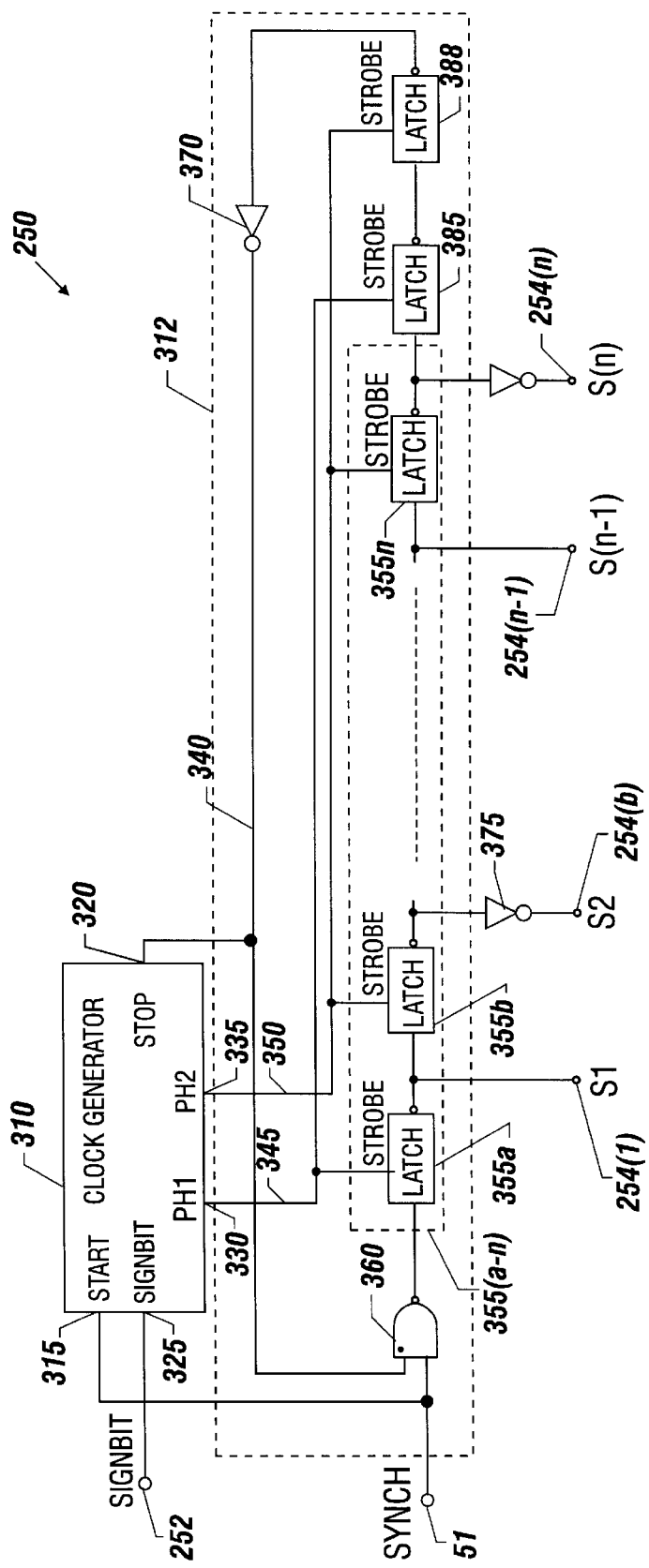
FIG. 3 depicts one embodiment of a strobe shift register that can be employed by the digital-to-analog converter of FIG. 2.

FIG. 3 illustrates one embodiment of the strobe shift register 250 of FIG. 2 in accordance with the present invention. The strobe shift register 250 comprises a clock generator 310 and a ripple shift register 312. The clock generator 310 includes a start-input terminal 315, a stop-input terminal 320, a second signbit-input terminal 325, and a first clock (PH1) and a second clock (PH2) output terminal 330, 335. The start-input terminal 315 is adapted to receive the synchronization signal from the synchronization-input terminal 251, the stop-input terminal 320 is adapted to receive the feedback signal from the line 340, and the second signbit-input terminal 325 is adapted to receive the signbit signal from the signbit-input terminal 252 of the strobe shift register 250. The first and second clock output terminals 330, 335 produce two non-overlapping clock signals on lines 345, 350, respectively.

The ripple shift register 312 includes a plurality of latches 355(a–n), a NAND gate 360, and an inverter 370. A first input terminal of the NAND gate 360 is coupled to the synchronization-input terminal 251 of the strobe shift register 250, and a second input terminal of the NAND gate 360 is coupled to an output terminal of the inverter 370. An output terminal of the NAND gate 360 is coupled to an input terminal of the first latch 355a. An output terminal of the first latch 355a is coupled to an input terminal of the second latch 355b. An output terminal of the second latch 355b is coupled to the third latch (355c, not shown). The remaining latches 355(c to n) are connected in a similar manner, as illustrated in FIG. 3. To avoid obscuring the invention, the intermediate latches have been omitted from the drawing.

The latches 355(a–n) are strobed by the first and second clock signals on lines 345, 350. Specifically, the first clock signal on the line 345 and second clock signal on the line 350 alternatively strobe the latches 355(a–n). That is, the first clock signal on the line 345 strobes the first latch 355a, the third latch (355c, not shown), and so forth until the last latch 355(n –1). Likewise, the second clock signal on the line 350 strobes the second latch 355b, the fourth latch (355d, not shown), and so forth until the next-to-last latch 355n.

The ripple shift register 312 includes a first and second control latch 385, 388. The control latches 385, 388 are required to ensure that latch 355n is turned low. This is done by delaying the output of the latch 355n by at least two clock phases before having such output stop the clock phases. An input terminal of the first control latch 385 is coupled to the output terminal of the last latch 355n of the plurality of latches 355(a–n), and an output terminal of the first control latch 385 is coupled to an input terminal of the second control latch 388. An output terminal of the second control latch 388 is coupled to an input terminal of the inverter 370.

The strobe shift register 250 provides n strobe signals through its output terminals 254(a–n). The first strobe signal of the n strobe signals is provided to the first output terminal 254a from the output terminal of the first latch 355a. The second strobe signal is provided to the second output terminal 254b from the output terminal of the second latch 355b via an inverter 375. The remaining strobe signals are similarly provided from the output terminals of respective latches 355(c to n) to the output terminals 254(c to n) of the strobe shift register 250. It should be noted that the strobe signals provided to the even numbered output terminals 254(b, d, . . . , n) are first inverted.

In the illustrated embodiment, the strobe shift register 250 comprises inverting latches 355(a–n), 385, 388. This allows the utilization of both of the non-overlapping clock signals on the lines 345, 350 of the clock generator 310 to advance the register 312 and reduces the frequency of the first and second clock signals on the lines 345, 350 by half. Using the non-overlapping clock signals 345, 350 and the inverting latches 355(a–n), 385, 388 reduces the area consumed by the ripple shift register 312. Those skilled in the art will appreciate that in other embodiments a master-slave clock configuration, as well as non-inverting latches, may also be employed to construct the ripple shift register 312.

Figure 4:
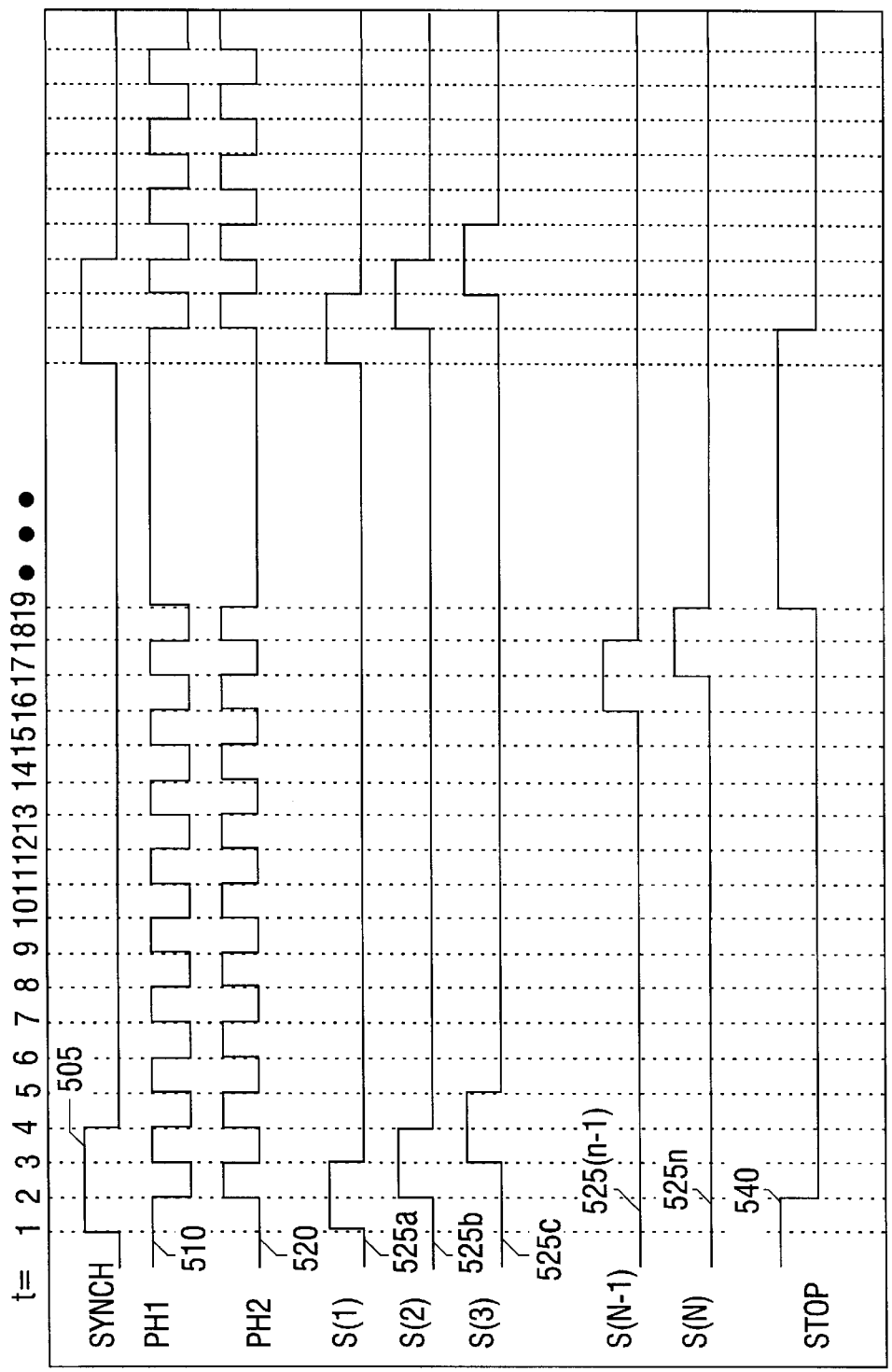
FIG. 4 illustrates a timing diagram of the strobe shift register of FIG. 3.

FIG. 4 illustrates an exemplary timing diagram of one embodiment of the strobe shift register 250. In response to the synchronization signal 505 on the terminal 251 at t=1, the clock generator 310 generates the non-overlapping first and second clocks 510, 520. The first clock 510, which is initially high, begins to cycle at the positive edge (t=1) of the synchronization signal 505, and the second clock 520, which is initially low, begins to cycle at the negative edge (t=2) of the first clock signal 510. The cycles of the first and second clocks 510, 520 end after the rippled strobe signal on the line 340 (see FIG. 3) reaches the stop-input terminal 320 of the clock generator 310.

The synchronization signal 505 from the synchronization-input terminal 251 (see FIG. 3) is provided to the start-input terminal 315 of the clock generator 250 (see FIG. 3). The synchronization signal 505 is concurrently provided to the first input terminal of the NAND gate 360 (see FIG. 3), so that once the clock generator 250 begins to cycle, the synchronization signal 505 begins to ripple through the register 312. As seen in FIG. 4, the strobe signals 525(a–n) are staggered, where the first strobe 525a is asserted first at t=1, and the next one is asserted half a clock cycle later, and so forth until the last strobe signal 525n at t=17. The NAND gate 360 limits the width of the strobe signals 525(a–n) once a stop signal 540 on the line 340 becomes low (t=2) at the first rising edge of the second clock signal 520. A clock period wider than the width of the strobe signals 525(a–n) could cause certain bit signals 220(a–n) (see FIG. 2) to remain transparent to any changing digital code. Such a condition could cause the bit signals 220(a–n) to change value at the R2R level prematurely, which can therefore damage the signal integrity.

Figure 5:
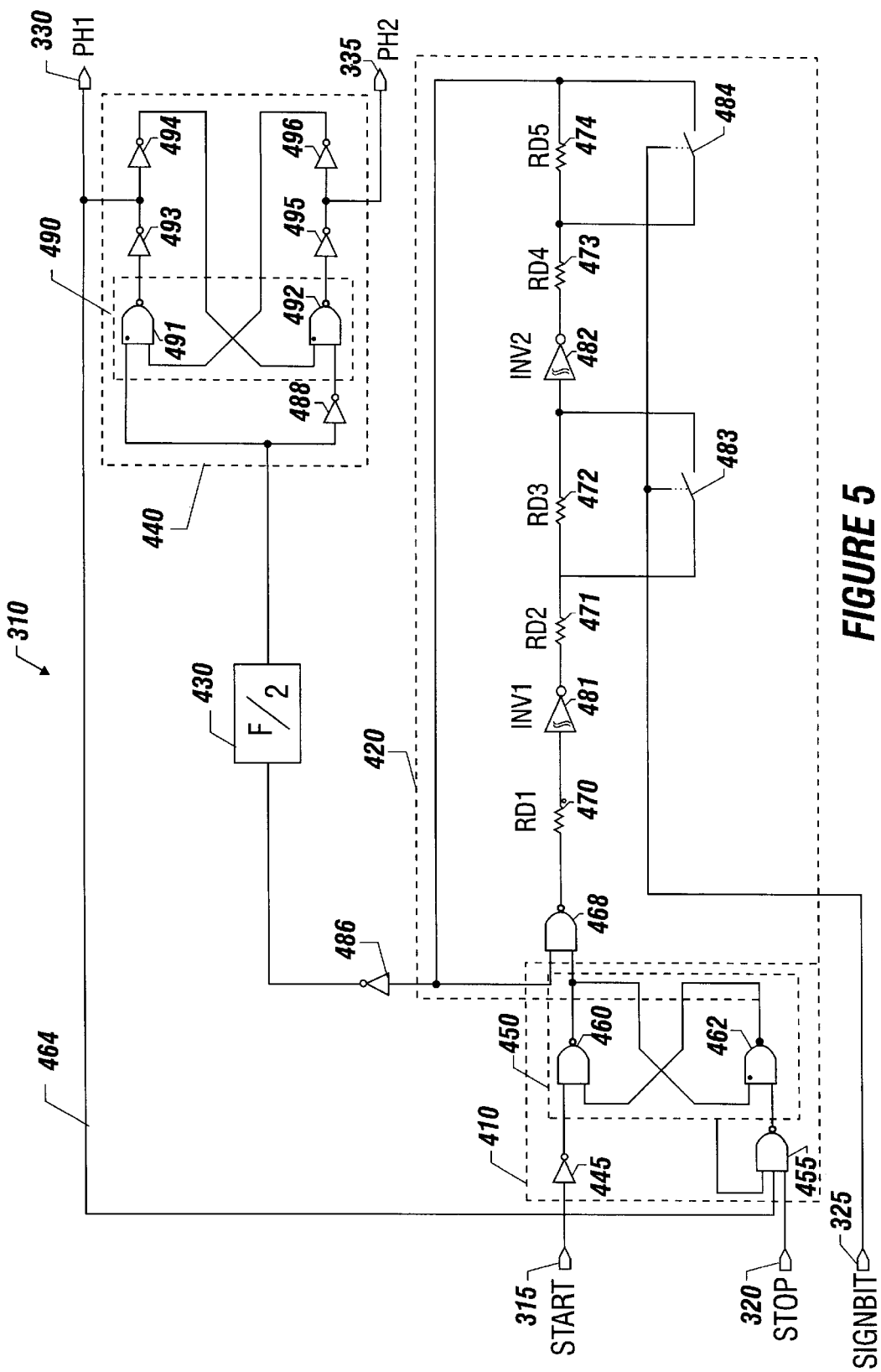
FIG. 5 depicts one embodiment of a clock generator that can be employed by the strobe shift register of FIG. 3.

FIG. 5 illustrates one embodiment of the clock generator 310 of FIG. 3. In the illustrated embodiment, the clock-generator 310 is a burst-clock generator that drives the ripple shift register 312. The clock generator 310 includes the start-input terminal 315, stop-input terminal 320, and second signbit-input terminal 325, and the first and second clock output terminals 330, 335. The start-input terminal 315 is coupled to the synchronization-input terminal 251, the stop-input terminal 320 is adapted to receive the feedback signal from the line 340, and the second signbit-input terminal 325 is coupled to the signbit-input terminal of the strobe shift register 250.

The clock generator 310 comprises four general sections: a trigger circuit 410, a ring oscillator 420, a frequency divider 430, and a non-overlap phase generator 440. The trigger circuit 410 controls the ring oscillator 420. That is, the ring oscillator 420 generates a primary clock signal in response to a trigger signal from the trigger circuit 410. The non-overlap phase generator 440 generates two non-overlapping clock signals using the primary clock signal generated by the ring oscillator 420.

The trigger circuit 410 includes an inverter 445, a flip-flop 450, and a control NAND gate 455. Although not so limited, the flip-flop 450 in the illustrated embodiment is an S-R flip-flop 450. The S-R flip-flop 450 includes first and second NAND gates 460, 462. An input terminal of the inverter 445 of the trigger circuit 410 is coupled to the start-input terminal 315 of the clock generator 310. A first input terminal of the first NAND gate 460 of the flip-flop 450 is coupled to an output terminal of the inverter 445, and the second input terminal of the first NAND gate 460 is coupled to an output terminal of a second NAND gate 462 of the flip-flop 450. The first, second, and third input terminals of the control NAND gate 455 are coupled to an output terminal of the first NAND gate 460, the stop-input terminal 320 of the clock generator 310, and the first clock signal, PH1, on a line 464, respectively. A first input terminal of the second NAND gate 462 of the flip-flop 450 is coupled to the output terminal of the first NAND gate 460, and a second input terminal of the second NAND gate 462 is coupled to an output terminal of the control NAND gate 455.

The ring oscillator 420 comprises a NAND gate 468, a plurality of resistors 470–474, and a plurality of inverters 481–482. The resistors 470–474 and inverters 481–482 provide a delay required by the ring oscillator to generate a clock signal. It is envisioned that other delay elements may be utilized in alternative embodiments to achieve the desired delay. Although not so limited, the illustrated embodiment comprises four diffusion resistors 470–474 and two inverters 481–482. The resistors 470–474 are similar to the diffusion resistors 210 of the D/A converter 200 shown in the FIG. 2, such that any variation in the ambient temperature and other such characteristics of the resistors 210 will likewise effect the resistors 470–474. Accordingly, any changes in the delay introduced by the parasitic capacitance or sheet resistivity of the resistors 210 (see FIG. 2) as a result of deviations in the characteristics of these resistors 210 will be appropriately tracked and accounted for by the resistors 470–474. That is, the resistors 470–474, because they will be effected similarly as the resistors 210, will increase or decrease the frequency of the primary clock signal as desired to account for any delay changes.

In FIG. 5, a first input terminal of the NAND gate 468 is coupled to the output terminal of the first NAND gate 460 of the flip-flop 450, and an output terminal of the NAND gate 468 is coupled to a first terminal of the first resistor 470. A second terminal of the first resistor 470 is coupled to an input terminal of the first inverter 481, and an output terminal of the first inverter 481 is coupled to a first terminal of the second resistor 471. A first terminal of the third resistor 472 is coupled to the second terminal of the second resistor 471, and a second terminal of the third resistor 472 is coupled to an input terminal of the second inverter 482. An output terminal of the second inverter 482 is coupled to a first terminal of the fourth resistor 473, and a second terminal of the fourth resistor 473 is coupled to a first terminal of the fifth resistor 474. A second terminal of the fifth resistor 474 is coupled to a second input terminal of the NAND gate 468 of the ring oscillator 420.

In response to the synchronization signal on the line 222 (see FIG. 2), the start-input terminal 315 triggers the S-R flip-flop 450, causing the output of the first NAND gate 460 of the S-R flip-flop 450 to become high. When the output of the first NAND gate 460 of the S-R flip-flop 450 becomes high, the NAND gate 468 of the ring oscillator 420 closes the feedback loop 466, thereby allowing the ring oscillator 420 to oscillate. The resistors 470–474 and inverters 481–482 introduce a delay in the feedback loop 466 that determines the frequency of the oscillation. Specifically, the frequency of the oscillation depends on the values of the resistors 470–474, as well as the width to length ratios of the inverters 481–482 of the ring oscillator 420.

The ring oscillator 420 also includes first and second switches 483, 484, where each switch 483, 484 has a control input coupled to the signbit-input terminal 325 of the clock generator 310. An input terminal of the first switch 483 is coupled to the first terminal of the third resistor 472, and an output terminal of the first switch 483 is coupled to the second terminal of the third resistor 472. An input terminal of the second switch 484 is coupled to the first terminal of the fifth resistor 474, and an output terminal of the second switch 484 is coupled to the second terminal of the fifth resistor 474. The first and second switches 483, 484 are capable of shorting the respective third and fifth resistors 472, 474 in response to the signbit signal from the signbit-input terminal 325 of the clock generator 310.

Due to the voltage coefficient of the diffusion resistors 210 (see FIG. 2), the delay introduced by the diffusion resistors 210 for the positive digital code is different from the delay introduced for the negative digital code. Thus, the polarity of the digital data affects the delay introduced by the diffusion resistors. Specifically, the delay for the negative digital code is shorter than it is for the positive digital code in an N-well process. Consequently, to account for the shorter delay, the first and second switches 483, 484 short the respective third and fifth resistors 472, 474 of the ring oscillator 420. Shorting the third and fifth resistors 472, 474 increases the frequency of the ring oscillator 472, 474, which in turn decreases the interval by which the strobe signals provided at the output terminals 254(a–n) of strobe shift register 250 (see FIG. 2) are delayed.

The ring oscillator 420 is coupled to the frequency divider 430 through an inverter 486. Accordingly, an input terminal of the inverter 486 is coupled to the second terminal of the fifth resistor 474 of the ring oscillator 420, and an output terminal of the inverter 486 is coupled to an input terminal of the frequency divider 430. The frequency divider 430 divides the primary oscillator frequency in half, which makes it possible to use smaller size resistors 470–474 in the ring oscillator 420. Thus, in an embodiment where the size of the resistors 470–474 is not of a significant factor, the frequency divider 430 may not be necessary. An output terminal of the frequency divider 430 is coupled to an input terminal of an inverter 488 of the non-overlap phase generator 440.

The non-overlap phase generator 440 includes a flip-flop 490 having first and second NAND gates 491, 492, as well as first, second, third, and fourth inverters 493–496. Although not so limited, the flip-flop 490 in the illustrated embodiment is an S-R flip-flop. The input terminal of the inverter 488 is coupled to a first input terminal of the first NAND gate 491 of the flip-flop 490, and an output terminal of the inverter 488 is coupled to a first input terminal of the second NAND gate 492. An output terminal of the first NAND gate 491 is coupled to an input terminal of the first inverter 493. An input terminal of the second inverter 494 is coupled to an output terminal of the first inverter 493, and an output terminal of the second inverter 494 is coupled to a second input terminal of the second NAND gate 492. An output terminal of the second NAND gate 492 is coupled to an input terminal of the third inverter 495. An input terminal of the fourth inverter 496 is coupled to an output terminal of the third inverter 495, and an output terminal of the fourth inverter 496 is coupled to a second input terminal of the first NAND gate 491. The first clock signal is derived from the output terminal of the first inverter 493, and the second clock signal is derived from the output terminal of the third inverter 495.

The present invention provides a method and apparatus for synchronizing the arrival of signals at the output terminal 292 of the D/A converter 200. The present invention, however, is not limited to the D/A converter 200 and, accordingly, may be implemented in a variety of electrical circuits including microprocessors, controllers, or integrated circuits.

Figure 6:
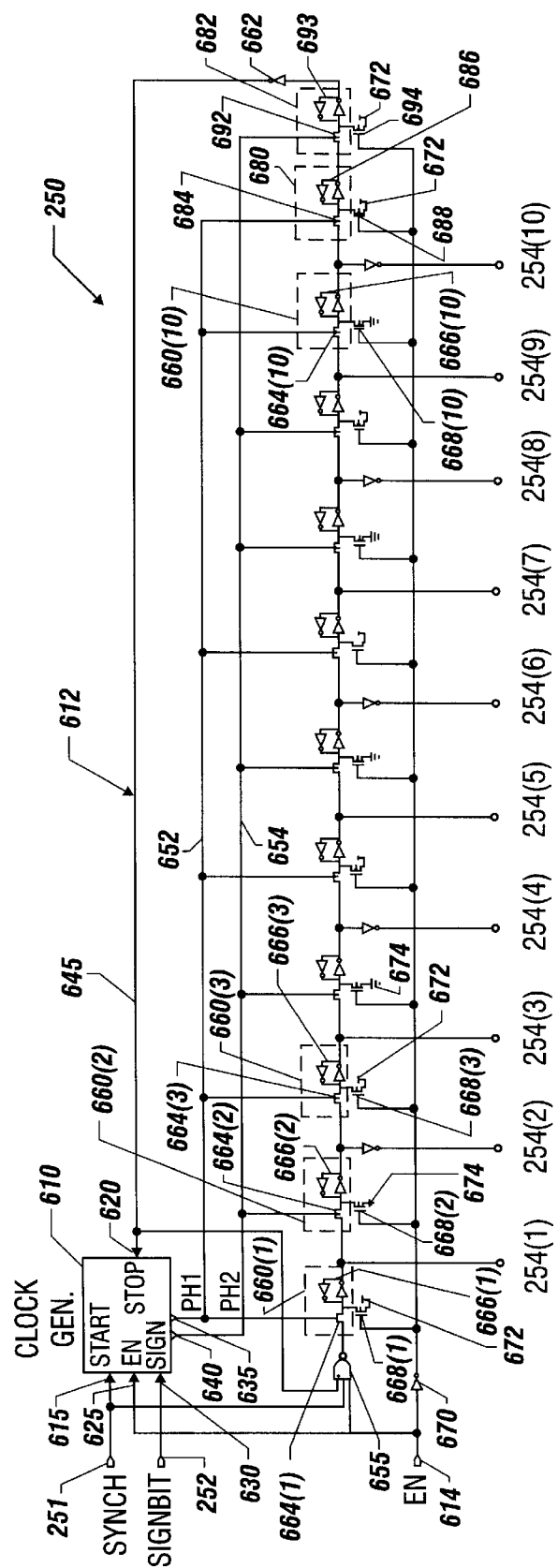
FIG. 6 illustrates a schematic diagram of an alternative embodiment of a strobe shift register that can be employed by the digital-to-analog converter of FIG. 2.

FIG. 6 illustrates a schematic embodiment of the strobe shift register 250 in accordance with the present invention. The strobe shift register 250 comprises a clock generator 610 and a ripple shift register 612. In the illustrated embodiment, the strobe shift register 250 includes an enable-input terminal 614, and comprises ten output terminals 254(1–10) capable of producing ten strobe signals. The clock generator 610 includes a start-input terminal 615, a stop-input terminal 620, a second enable-input terminal 625, a signbit-input terminal 630, and a first clock (PH1) and a second clock (PH2) output terminal 635, 640. The start-input terminal 615 is adapted to receive the synchronization signal from the synchronization-input terminal 251 (see FIG. 2), the stop-input terminal 620 is adapted to receive the feedback signal from the line 645, the second enable-input terminal 625 is adapted to receive the enable signal from the enable-input terminal 614 of the strobe shift register 250, and the signbit-input terminal 630 is adapted to receive the signbit signal from the signbit-input terminal 252. The first and second clock output terminals 635, 640 produce two non-overlapping clock signals on lines 652, 654, respectively.

The ripple shift register 612 includes ten latches 660 (1–10), a NAND gate 655, and an inverter 662. In the illustrated embodiment, the strobe shift register 250 includes latches 660(1–10) that are capable of providing the ten strobe signals to the ten output terminals 254(1–10). A first input terminal of the NAND gate 655 is coupled to the synchronization-input terminal 251 (see FIG. 2), a second input terminal is coupled to an output of the inverter 662, and a third input terminal is coupled to the enable-input terminal 614. An output terminal of the NAND gate 655 is coupled to an input terminal of a first latch 660(1) of the ten latches 660(1–10).

In the illustrated embodiment, the first latch 660(1) comprises a transistor 664(1) and back-to-back inverters 666(1). The transistor 664(1) of the first latch 660(1) includes a gate terminal coupled to the first clock signal on the line 654, a drain terminal coupled to a first terminal of the back-to-back inverters 666(1), and a source terminal coupled to an output of the NAND gate 655. The strobe shift register 250 includes a reset transistor 668(1) for the first latch 660(1). The reset transistor 668(1) comprises a gate terminal that is coupled to the enable-input terminal 614 via an inverter 670, a source terminal that is coupled to the drain terminal of the transistor 664(1) of the first latch 660(1), and a drain terminal that is coupled to a voltage supply node ($V_{cc}$) 672.

A transistor 664(2) of a second latch 660(2) includes a gate terminal coupled to the second clock signal on the line 654, a drain terminal coupled to a first terminal of the back-to-back inverters 666(2), and a source terminal coupled to a second terminal of the back-to-back inverters 666(1) of the first latch 660(1). The strobe shift register 250 includes a reset transistor 668(2) for the second latch 660(2). The reset transistor 668(2) comprises a gate terminal that is coupled to the enable-input terminal 614 via the inverter 670, a source terminal that is coupled to the drain terminal of the transistor 664(2) of the second latch 660(2), and a drain terminal that is coupled to a ground node 674.

A transistor 664(3) of a third latch 660(3) includes a gate terminal coupled to the first clock signal on the line 652, a drain terminal coupled to a first terminal of the back-to-back inverters 666(3), and a source terminal coupled to a second terminal of the back-to-back inverters 666(2) of the second latch 660(2). The strobe shift register 250 includes a reset transistor 668(3) for the third latch 660(3). The reset transistor 668(3) comprises a gate terminal that is coupled to the enable-input terminal 614 via the inverter 670, a source terminal that is coupled to the drain terminal of the transistor 664(3) of the third latch 660(3), and a drain terminal that is coupled to the voltage supply node ($V_{cc}$) 672.

As can be seen in FIG. 6, the odd latches 660(5,7,9) are connected in a similar manner to the third latch 660(3), while the even latches 660(4,6,8,10) are connected in a similar manner to the second latch 660(2). The odd latches 660(1,3,5,7,9) are strobed by the first clock signal on the line 652, and the even latches 660(4,6,8,10) are strobed by the second clock signal on the line 654.

The strobe shift register 250 comprises an eleventh and twelfth latch 680, 682. A transistor 684 of the eleventh latch 680 includes a gate terminal coupled to the first clock signal on the line 652, a drain terminal coupled to a first terminal of the back-to-back inverters 686, and a source terminal coupled to a second terminal of the back-to-back inverters 666(10) of the tenth latch 660(10). The strobe shift register 250 includes a reset transistor 688 for the eleventh latch 680. The reset transistor 688 comprises a gate terminal that is coupled to the enable-input terminal 614 via the inverter 670, a source terminal that is coupled to the drain terminal of the transistor 684 of the eleventh latch 680, and a drain terminal that is coupled to the voltage supply node ($V_{cc}$) 672.

A transistor 692 of the twelfth latch 682 includes a gate terminal coupled to the second clock signal on the line 654, a drain terminal coupled to a first terminal of the back-to-back inverters 693, and a source terminal coupled to a second terminal of the back-to-back inverters 686 of the eleventh latch 680. A second input terminal of the back-to-back inverters 693 of the twelfth latch 682 is coupled to an input terminal of the inverter 662. The strobe shift register 250 includes a reset transistor 694 for the twelfth latch 682. The reset transistor 694 comprises a gate terminal that is coupled to the enable-input terminal 614 via the inverter 670, a source terminal that is coupled to the drain terminal of the transistor 692 of the twelfth latch 682, and a drain terminal that is coupled to the voltage supply node ($V_{cc}$) 672.

The strobe shift register 250 provides ten strobe signals through its ten-output terminals 254(1–10). The first strobe signal is obtained from the output of the first latch 660(1) of the ripple shift register 612 and is then provided to the first output terminal 254(1) of the strobe shift register 250. As illustrated in FIG. 6, the remaining odd numbered strobe signals are similarly obtained from the output terminals of the odd numbered latches 660(3,5,7,9) and then provided to the odd numbered output terminals 254(3,5,7,9) of the strobe shift register 250. The second strobe signal is obtained from the output of the second latch 660(2) of the ripple shift register 612 and is then provided to the second output terminal 254(2) via an inverter 696. As is apparent in FIG. 6, the remaining even numbered strobe signals are similarly obtained from the output terminals of the even numbered latches 660(4,6,8,10) and then provided to the even numbered output terminals 254(4,6,8,10) of the strobe shift register 250.

Figure 7:
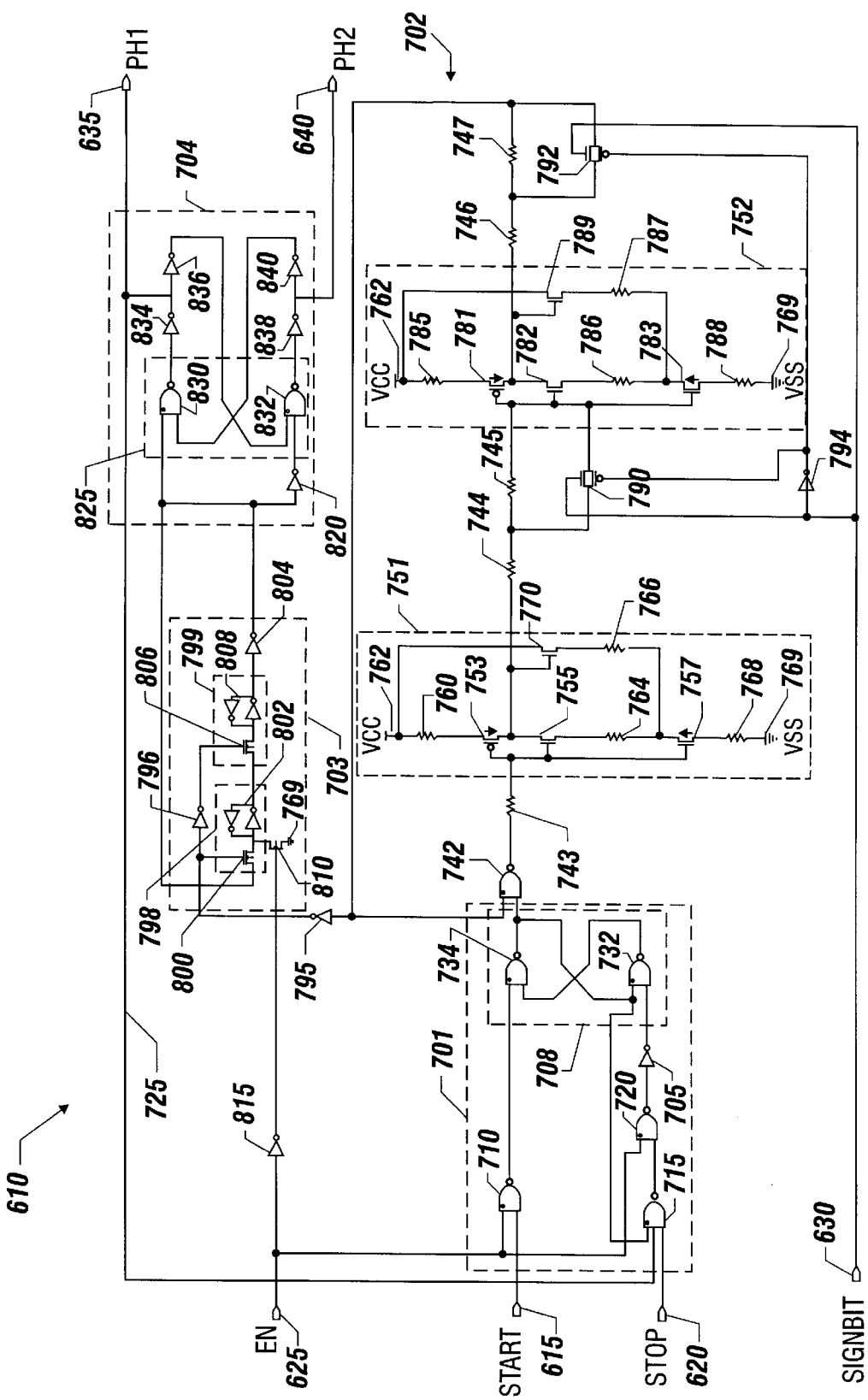
FIG. 7 illustrates a schematic diagram of one embodiment of a clock generator that can be employed by the strobe shift register of FIG. 6.

FIG. 7 illustrates a schematic embodiment of the clock generator 610 of FIG. 6. The clock generator 610 includes the start-input terminal 615, stop-input terminal 620, second enable-input terminal 625, signbit-input terminal 630 and the first and second clock output terminals 635, 640. The start-input terminal 615 is adapted to receive the synchronization signal from the synchronization-input terminal 251 (see FIG. 2), the stop-input terminal 620 is adapted to receive the feedback signal from the line 645 (see FIG. 6), the second enable-input terminal 625 is adapted to receive the enable signal from the enable-input terminal 614 of the strobe shift register 250, and the signbit-input terminal 630 is adapted to receive the signbit signal from the signbit-input terminal 252 of the strobe shift register 250 (see FIG. 2).

The clock generator comprises four general sections—the trigger circuit 701, a ring oscillator 702, a frequency divider 703, and a non-overlap phase generator 704. The trigger circuit 701 includes an inverter 705, a flip-flop 708, and first-, second-, and third-control NAND gates 710, 715, 720. A first input terminal of the first-control NAND gate 710 is coupled to the start-input terminal 615, and a second input terminal of the first-control NAND gate 710 is coupled to the second enable-input terminal 625. The second-control NAND gate 715 has a first input terminal coupled to the stop-input terminal 620, a second input terminal coupled to a first clock signal on a line 725, and a third input terminal coupled to an output terminal of a first NAND gate 732 of the flip-flop 708 of the trigger circuit 701. A first input terminal of the third-control NAND gate 720 is coupled to an output terminal of the second-control NAND gate 715, and a second input terminal of the third-control NAND gate 720 is coupled the second enable-input terminal 625.

Although not so limited, the flip-flop 708 of the trigger circuit 701 in the illustrated embodiment is an S-R flip-flop 708. The S-R flip-flop 708 includes a first NAND gate 734 and the second NAND gate 732. A first input terminal of the first NAND gate 734 of the flip-flop 708 is coupled to an output terminal of the first-control NAND gate 710, and the second input terminal of the first NAND gate 734 is coupled to an output of the second NAND gate 732 of the flip-flop 708. An input terminal of the inverter 705 of the trigger circuit 701 is coupled to an output terminal of the third-control NAND gate 720, and an output of the inverter 705 is coupled to a first input terminal of the second NAND gate 732 of the flip-flop 708. A second input terminal of the second NAND gate 732 is coupled to an output terminal of the first NAND gate 734 of the flip-flop 708.

The ring oscillator 702 comprises a loop that includes a NAND gate 742, a plurality of resistors 743–747 and inverters 751–752. Although not so limited, the illustrated embodiment comprises four diffusion resistors 743–747 and two Schmidt-trigger inverters 751–752. A first input terminal of the NAND gate 742 is coupled to the output terminal of the first NAND gate 734 of the flip-flop 708, and an output terminal of the NAND gate 742 is coupled to a first terminal of the first resistor 743. A second terminal of the first resistor 743 is coupled to an input terminal of the first inverter 751, and an output terminal of the first inverter 751 is coupled to a first terminal of the second resistor 744. A first terminal of the third resistor 745 is coupled to the second terminal of the second resistor 744, and a second terminal of the third resistor 745 is coupled to an input terminal of the second inverter 752. An output terminal of the second inverter 752 is coupled to a first terminal of the fourth resistor 746, and a second terminal of the fourth resistor 746 is coupled to a first terminal of the fifth resistor 747. A second terminal of the fifth resistor 747 is coupled to a second input terminal of the NAND gate 742 of the ring oscillator 702.

The first inverter 751 of the ring oscillator 702 includes a gate terminal of a first, second, and third transistor 753, 755, 757 coupled to the input terminal of the inverter 751. Although not so limited, the first transistor 753 is a p-channel metal-oxide semiconductor (MOS) transistor, and the second and third transistors 755, 757 are n-channel MOS transistors. A first terminal of a first resistor 760 is coupled to a supply voltage node ($V_{cc}$) 762, and a second terminal of the first resistor 760 is coupled to a source terminal of the first transistor 753. A drain terminal of the first transistor 753 is coupled to a drain terminal of the second transistor 755, and a source terminal of the second transistor 755 is coupled to a first terminal of a second resistor 764. A second terminal of the second resistor 764 is coupled to a drain terminal of the third transistor 757, as well as to a first terminal of a third resistor 766. A first terminal of a fourth resistor 768 is coupled to a drain terminal of the third transistor 757, and a second terminal of the fourth resistor 768 is coupled to a ground node ($V_{ss}$) 169. The first inverter 751 includes a fourth transistor 770, which, in the illustrated embodiment, is a n-channel MOS transistor. The fourth transistor 770 has a gate terminal coupled to the drain terminal of the first and second transistors 753, 755, a source terminal coupled to the voltage supply node ($V_{cc}$) 762, and a drain terminal coupled to a second terminal of the fourth resistor 766. The resistors 760, 764, 766, 768 alleviate the effects of process variations on the transistors 753, 755, 757, 770. Process variations may include deviations in concentration of material that are utilized in diffusion to make the resistors, varying mask sizes, or the like.

The second inverter 752 is similar to the first inverter 751. The input terminal of the second inverter 752 is coupled to a gate terminal of first, second, and third transistors 781, 782, 783. A first terminal of a first resistor 785 is coupled to the voltage supply node ($V_{cc}$) 762, and a second terminal of the first resistor 785 is coupled to a source terminal of the first transistor 781. A drain terminal of the first transistor 781 is coupled to a drain terminal of the second transistor 782, and a source terminal of the second transistor 782 is coupled to a first terminal of a second resistor 786. A second terminal of the second resistor 786 is coupled to a drain terminal of the third transistor 783, as well as to a first terminal of a third resistor 787. A first terminal of a fourth resistor 788 is coupled to a drain terminal of the third transistor 783, and a second terminal of the fourth resistor 788 is coupled to the ground node ($V_{ss}$) 769. The second inverter 752 includes a fourth transistor 789, which, in the illustrated embodiment, is an n-channel MOS transistor. The fourth transistor 789 has a gate terminal coupled to the drain terminal of the first and second transistors 781, 782, a source terminal coupled to the voltage supply node ($V_{cc}$) 762, and a drain terminal coupled to a second terminal of the fourth resistor 788. The resistors 785–788 alleviate the effects of process variations on the transistors 781, 782, 783, 789.

The ring oscillator 702 includes first and second switches 790, 792. A control input terminal of the first switch 790 is coupled to the signbit-input terminal 630, and a control input terminal of the second switch 792 is coupled to the signbit-input terminal 630 via an inverter 794. Although not so limited, the switches 790, 792 in the illustrated embodiment are pass gate switches. An input terminal of the first switch 790 is coupled to the first terminal of the third resistor 745, and an output terminal of the first switch 790 is coupled to the second terminal of the third resistor 745 of the ring oscillator 702. An input terminal of the second switch 792 is coupled to the first terminal of the fifth resistor 747, and an output terminal of the second switch is coupled to the second terminal of the fifth resistor 747 of the ring oscillator 702. The first and second switches 790, 792 are designed to short the respective third and fifth resistors 745, 747 in response to a signbit signal received from the signbit-input terminal 630.

The ring oscillator 702 is coupled to the frequency divider 703 through an inverter 795. Accordingly, an input terminal of the inverter 795 is coupled to the second terminal of the fifth resistor 745 of the ring oscillator 702, and an output terminal of the inverter 795 is coupled to an input terminal of a first inverter 796 of the frequency divider 703. The frequency divider 703 includes a first and second latch 798, 799. The first latch 798 comprises a transistor 800 and back-to-back inverters 802. The transistor 800 includes a gate terminal coupled to the input terminal of the inverter 795, a drain terminal coupled to first terminal of the back-to-back inverters 802, and a source terminal coupled an output terminal of a second inverter 804 of the frequency divider 703. Similar to the first latch 798, the second latch 799 comprises a transistor 806 and back-to-back inverters 808. The transistor 806 of the second latch 799 has a gate terminal coupled to an output terminal of the first inverter 796, a source terminal coupled to a second terminal of the back-to-back inverters 802 of the first latch 798, and a drain terminal coupled to a first terminal of the back-to-back inverters 808 of the second latch 799. The second terminal of the back-to-back inverters 808 of the second latch 799 is coupled to an input terminal of the second inverter 804.

The frequency divider 703 includes a transistor 810 having a gate terminal adapted to receive a signal from the second enable-input terminal 625 via an inverter 815. The transistor 810 includes a source terminal coupled to the drain terminal of the transistor 800 of the first latch 798, and a drain terminal coupled to the ground node ($V_{ss}$) 769. In the illustrated embodiment, although not so limited, the transistors 800, 806 of the first and second latches 798, 799 are n-channel CMOS transistors. An output terminal of the second inverter 804 of the frequency divider 703 is coupled to an input terminal of an inverter 820 of the non-overlap phase generator 704.

The non-overlap phase generator 704 includes a flip-flop 825 having first and second NAND gates 830, 832, as well as first, second, third, and fourth inverters 834, 836, 838, 840. Although not so limited, the flip-flip 825 in the illustrated embodiment is an S-R flip-flop. The input terminal of the inverter 820 is coupled to a first input terminal of the first NAND gate 830 of the flip-flop 825, and an output terminal of the inverter 820 is coupled to a first input terminal of the second NAND gate 832 of the flip-flop 825. An output terminal of the first NAND gate 830 is coupled to an input terminal of the first inverter 834. An input terminal of the second inverter 836 is coupled to an output terminal of the first inverter 834, and an output terminal of the second inverter 836 is coupled to a second input terminal of the second NAND gate 832 of the flip-flop 825. An output terminal of the second NAND gate 832 is coupled to an input terminal of the third inverter 838. An input terminal of the fourth inverter 840 is coupled to an output terminal of the third inverter 838, and output terminal of the fourth inverter 840 is coupled to a second input terminal of the first NAND gate 830 of the flip-flop 825. The first clock signal is derived from the output terminal of the first inverter 832, and the second clock signal is derived from the output terminal of the third inverter 838 of the ring oscillator 704.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of synchronizing the arrival of data delivered over a first and second path, comprising:

generating a clock signal;

delivering the data to the first path in response to receiving the clock signal;

delaying the clock signal by a preselected time, wherein the first preselected time substantially corresponds to a difference in the time required for the data to propagate the first and second paths; and delivering the data to the second path in response to receiving the delayed clock signal.

2. The method of claim 1, wherein generating a clock signal includes generating a first and second non-overlapping clock signal having a period that substantially correspond to a difference in the time required for the data to propagate the first and second paths and wherein the data is delivered to the first path in response to the first non-overlapping clock signal and the data is delivered to the second path in response to the receiving the second non-overlapping clock signal.

3. The method of claim 2, wherein the data is digital code.

4. The method of claim 3, wherein delivering the data to the first path in response to receiving the clock signal includes delivering the data to an output terminal of a digital-to-analog converter.

5. The method of claim 4, wherein the first and second paths have restivity that is responsive to ambient temperature and wherein the second strobe signal is provided after a preselected time after the first strobe signal in response to changes in the ambient temperature.

6. The method of claim 5, wherein the difference in the time required for the data to propagate the first and second paths is responsive to polarity of the data and wherein the strobe generator is capable of providing the second strobe signal a preselected time after the first strobe signal in response to the polarity of the data.

7. The method of claim 6, wherein delivering the data to the second path in response to receiving the delayed clock signal includes delivering the data to the output terminal of the digital-to-analog converter.

8. An apparatus, comprising:
- a first storing device having an input terminal and a strobe input terminal, the first storing device capable of storing data at the input terminal and delivering the data to a first path in response to a first strobe signal;
- a second storing device having an input terminal and a strobe input terminal, the second storing device capable of storing data at the input terminal and delivering the data to a second path in response to a second strobe signal; and
- a strobe generator capable of providing a first strobe signal to the strobe input terminal of the first storing device and capable of providing a second strobe signal to the strobe input terminal of the second storing device, wherein the second strobe signal is provided a preselected time after the first strobe signal and wherein the first preselected time substantially corresponds to a difference in the time required for the data to propagate the first and second paths.

9. The apparatus of claim 8, wherein the first and second paths have resitivity that is responsive to ambient temperature and wherein the strobe generator is capable of providing the second strobe signal a preselected time after the first strobe signal in response to changes in the ambient temperature.

10. The apparatus of claim 8, wherein the first and second paths have parasitic capacitance that is responsive to process and resitivity that is responsive to ambient temperature and wherein the strobe generator is capable of providing the second strobe signal a preselected time after the first strobe signal in response to changes in the ambient temperature.

11. The apparatus of claim 10, wherein the difference in the time required for the data to propagate the first and second paths is responsive to polarity of the data and wherein the strobe generator is capable of providing the second strobe signal a preselected time after the first strobe signal in response to the polarity of the data.

12. The apparatus of claim 11, wherein the strobe generator is a strobe shift generator having a control input, wherein the strobe shift generator provides the first and second strobe signal in response to a control signal.

13. The apparatus of claim 12, wherein the first storage device is a first latch, and the second storage device is a second latch.

14. The apparatus of claim 13, wherein the strobe shift generator comprises:
- a clock generator capable of generating a first clock and second clock in response to the control signal, wherein the first and second clocks are non-overlapping clocks; and
- a ripple shift register, comprising:
  - a first latch having an input terminal, an output terminal, and a control input terminal, the output terminal capable of providing the first strobe signal in response to the first clock signal being asserted at the control input terminal; and
  - a second latch having an input terminal, an output terminal, and a control input terminal, the input terminal of the second latch coupled the output terminal of the first latch, wherein output terminal of the second latch is capable of providing the second strobe signal in response to the second clock signal being asserted at the control input terminal of the second latch.

15. The apparatus of claim 14, wherein the clock generator is capable of terminating the first and second clock signals in response to a termination signal provided from an output terminal of the ripple shift register.

16. The apparatus of claim 15, wherein the ripple shift register includes:
- an inverter having an input terminal and an output terminal capable of providing the termination signal;
- a NAND gate having a first input terminal adapted to receive the control signal, a second input coupled to the output terminal of the ripple shift register, and an output terminal coupled to an input terminal of the first latch;
- a first control inverting latch having an input terminal coupled to an output terminal of the second latch, a control input tenninal adapted to receive the first clock signal; and
- a second latch inverting having an input terminal coupled to an output terminal of the first control latch, a control input terminal adapted to receive the second clock signal, and an output terminal coupled to the input terminal of the inverter.

17. The apparatus of claim 16, wherein the clock generator comprises:
- a trigger circuit capable of generating a triggering signal in response to receiving the control signal;
- a ring oscillator capable of generating a clock signal in response to receiving the triggering signal; and
- a non-overlap phase generator capable of receiving the clock signal and generating the first and second clock signals, wherein the first and second clock signals are non-overlapping clock signals.

18. The apparatus of claim 16, wherein the clock generator comprises:
- trigger circuit capable of generating a triggering signal in response to receiving the control signal;
- a ring oscillator capable of generating a clock signal in response to receiving the triggering signal;
- a frequency divider capable of dividing the frequency of the clock signal by substantially half and providing a clock output signal; and
- a non-overlap phase generator capable of receiving the clock output signal and generating the first and second clock signals, wherein the first and second clock signals are non-overlapping clock signals.

19. A digital-to-analog converter, comprising:
- a first switch having a control input terminal, the first switch capable of delivering a first signal to a first path in response to a first control signal;
- a second switch having a control input terminal, the second switch capable of delivering a second signal to a second path in response to a second control signal;
- a first storing device having an input terminal and a strobe input terminal, the first latch capable of latching data at the input terminal in response to a first strobe signal and capable of providing the data as the first control signal to the control input terminal of the first switch;
- a second storing device having an input terminal and a strobe input terminal, the second latch capable of latching data at the input terminal in response to a second strobe signal and capable of providing the data as the second control signal to the control input terminal of the second switch; and
- a strobe generator capable of providing the first strobe signal to the strobe input terminal of the first latch and capable of providing the second strobe signal to the strobe input terminal of the second latch, wherein the second strobe signal is provided a preselected time after the first strobe signal and wherein the preselected time substantially corresponds to a difference in the time required for the first signal to propagate the first path and the second signal to propagate the second path.

20. The digital-to-analog converter of claim 19, wherein the strobe generator is a strobe shift generator having a control input, wherein the strobe shift generator provides the first and second strobe signal in response to a control signal.

21. The digital-to-analog converter of claim 20, wherein the first storage device is a first latch, and the second storage device is a second latch.

22. The digital-to-analog converter of claim 21, wherein the strobe shift generator comprises:
   a clock generator capable of generating a first clock and second clock in response to the control signal, wherein the first and second clocks are non-overlapping clocks; and
   a ripple shift register, comprising:
      a first latch having an input terminal, an output terminal, and a control input terminal, the output terminal capable of providing the first strobe signal in response to the first clock signal being asserted at the control input terminal; and
      a second latch having an input terminal, an output terminal, and a control input terminal, the input terminal of the second latch coupled the output terminal of the first latch, wherein output terminal of the second latch is capable of providing the second strobe signal in response to the second clock signal being asserted at the control input terminal of the second latch.

23. The digital-to-analog converter of claim 25, wherein the clock generator is capable of terminating the first and second clock signals in response to a termination signal provided from an output terminal of the ripple shift register.

24. The digital-to-analog converter of claim 23, wherein the ripple shift register includes:
   an inverter having an input terminal and an output terminal capable of providing the termination signal;
   a NAND gate having a first input terminal adapted to receive the control signal, a second input coupled to the output terminal of the ripple shift register, and an output terminal coupled to an input terminal of the first latch;
   a first control inverting latch having an input terminal coupled to an output terminal of the second latch, a control input terminal adapted to receive the first clock signal; and
   a second latch inverting having an input terminal coupled to an output terminal of the first control latch, a control input terminal adapted to receive the second clock signal, and an output terminal coupled to the input terminal of the inverter.

25. The digital-to-analog converter of claim 24, wherein the clock generator comprises:
   a trigger circuit capable of generating a triggering signal in response to receiving the control signal;
   a ring oscillator capable of generating a clock signal in response to receiving the triggering signal; and
   a non-overlap phase generator capable of receiving the clock signal and generating the first and second clock signals, wherein the first and second clock signals are non-overlapping clock signals.

26. The digital-to-analog converter of claim 24, wherein the clock generator comprises:
   a trigger circuit capable of generating a triggering signal in response to receiving the control signal;
   a ring oscillator capable of generating a clock signal in response to receiving the triggering signal;
   a frequency divider capable of dividing the frequency of the clock signal by substantially half and providing a clock output signal; and
   a non-overlap phase generator capable of receiving the clock output signal and generating the first and second clock signals, wherein the first and second clock signals are non-overlapping clock signals.

27. The digital-to-analog converter of claim 26, wherein the trigger circuit comprises:
   a flip-flop having a first and second input terminal and a first and second output terminal, the first output terminal capable of providing the triggering signal;
   a control NAND gate having a first input terminal adapted to receive the termination signal, a second input terminal adapted to receive the first clock signal a third input terminal coupled to the first output terminal of the of flip-flop, and an output terminal coupled to the second input terminal of the flip-flop; and
   an inverter having an input terminal adapted to receive the control signal and an output terminal coupled to the first input terminal of the flip-flop.

28. The digital-to-analog converter of claim 27, wherein the flip-flop is an S-R flip-flop.

29. The digital-to-analog converter of claim 26, wherein the ring oscillator comprises:
   a NAND gate having a first and second input terminal and an output terminal, the first input terminal adapted to receive the triggering signal; and
   a delay element having an input terminal coupled to the output terminal of the NAND gate and an output terminal coupled to the second input terminal of the NAND gate.

30. The digital-to-analog converter of claim 29, further comprising a plurality of delay elements interconnected serially, wherein a last delay element of the plurality of delay element is coupled to the second input terminal of the NAND gate.

31. The digital-to-analog converter of claim 30, wherein the plurality of delay elements comprises a resistor and an inverter, wherein a first terminal of the resistor is coupled to the output terminal of the NAND gate, a second terminal of the resistor is coupled to an input terminal of the inverter, and an output terminal of the inverter is coupled to the second input terminal of the NAND gate.

32. The digital-to-analog converter of claim 29, wherein the ring oscillator includes a switch capable of adjusting the delay provided by the delay element in response to receiving a negative digital code.

33. The digital-to-analog converter of claim 26, wherein the non-overlap phase generator comprises:
   a control inverter having input terminal and an output terminal, the input terminal is adapted to receive the clock output terminal from the frequency divider;
   a flip-flop, comprising:
      a first NAND gate having a first and second input terminal and an output terminal, the first input terminal adapted to receive the clock output terminal from the frequency divider;

a second NAND gate having a first and second input terminal and an output terminal, the first input terminal coupled to the output terminal of the control inverter;

a first inverter having an input and an output terminal, the input terminal coupled to the output terminal of the first NAND gate and the output terminal capable of providing the first clock signal;

a second inverter having an input terminal coupled to the output terminal of the first inverter and an output terminal coupled to the second input terminal of the second NAND gate;

a third inverter having an input and an output terminal, the input terminal is coupled to the output terminal of the second NAND gate and the output terminal capable of providing the second clock signal; and a fourth inverter having an input terminal coupled to the output terminal of the third inverter and an output terminal coupled to the second input terminal of the first NAND gate.

34. An apparatus for synchronizing the arrival of data delivered over a first and second path, comprising:

means for generating a clock signal;

means for delivering the data to the first path in response to receiving the clock signal;

means for delaying the clock signal by a preselected time, wherein the first preselected time substantially corresponds to a difference in the time required for the data to propagate the first and second paths; and means for delivering the data to the second path in response to receiving the delayed clock signal.

* * * * *